United States Patent
Zhadobov et al.

(10) Patent No.: US 10,739,392 B2
(45) Date of Patent: Aug. 11, 2020

(54) DEVICE FOR ELECTROMAGNETIC DOSIMETRY AND ASSOCIATED METHOD

(71) Applicants: UNIVERSITE DE RENNES 1, Rennes (FR); CENTRE NATIONAL DE LA RECHERCHE SCIENTIFIQUE—CNRS, Paris (FR)

(72) Inventors: Maxim Zhadobov, Betton (FR); Artem Boriskin, Thorigne-Fouillard (FR)

(73) Assignees: UNIVERSITÉ DE RENNES 1, Rennes (FR); CENTRE NATIONAL DE LA RECHERCHE SCIENTIFIQUE—CNRS, Paris (FR)

( * ) Notice: Subject to any disclaimer, the term of this patent is extended or adjusted under 35 U.S.C. 154(b) by 280 days.

(21) Appl. No.: 15/747,217

(22) PCT Filed: Jul. 20, 2016

(86) PCT No.: PCT/FR2016/051880
§ 371 (c)(1),
(2) Date: Jun. 25, 2018

(87) PCT Pub. No.: WO2017/017350
PCT Pub. Date: Feb. 2, 2017

(65) Prior Publication Data
US 2018/0292438 A1    Oct. 11, 2018

(30) Foreign Application Priority Data
Jul. 24, 2015   (FR) ..................... 15 01595

(51) Int. Cl.
*G01R 29/08*   (2006.01)

(52) U.S. Cl.
CPC ............... *G01R 29/0857* (2013.01)

(58) Field of Classification Search
None
See application file for complete search history.

(56) References Cited

U.S. PATENT DOCUMENTS

| | | | |
|---|---|---|---|
| 7,186,377 B2 * | 3/2007 | Iyama | G01R 29/08 343/701 |
| 7,615,188 B2 * | 11/2009 | Iyama | G01R 29/08 343/701 |

(Continued)

FOREIGN PATENT DOCUMENTS

| | | |
|---|---|---|
| CN | 1651907 A | 8/2005 |
| FR | 2851823 A1 | 9/2004 |
| WO | 2015099958 A1 | 7/2015 |

OTHER PUBLICATIONS

Guraliuc, A. R., et al., "Solid Phantom for Body-Centric Propagation Measurements at 60 GHz," IEEE Transactions on Microwave Theory and Techniques, IEEE Service Center, Piscataway, NJ, US, vol. 62, No. 6, Jun. 1, 2014, pp. 1373-1380, XP011549851.

(Continued)

*Primary Examiner* — Paresh Patel
(74) *Attorney, Agent, or Firm* — Kenealy Vaidya LLP

(57) ABSTRACT

Some embodiments relate to a device for simulating characteristics of human tissues in electromagnetic dosimetry. The device includes a substrate bearing a metallised shielding, a layer of a dielectric material arranged on or preferentially beneath the substrate and the device including a plurality of openings made in the shielding and at least one array of sensors in the layer of dielectric material.

11 Claims, 1 Drawing Sheet

(56) References Cited

U.S. PATENT DOCUMENTS

2004/0017115 A1    1/2004  Ozaki et al.
2013/0099119 A1    4/2013  Derat et al.
2015/0188233 A1*   7/2015  Chen ..................... H01Q 15/14
                                                      342/5

OTHER PUBLICATIONS

Search Report from French Patent App. No. 1501595 (dated Jun. 20, 2016).
International Search Report and Written Opinion for PCT Patent App. No. PCT/FR2016/051880 (dated Nov. 10, 2016) with partial English language translation.
Aug. 7, 2019 of Search Report issued in corresponding Chinese Patent Application No. 2016800546287.

* cited by examiner

DEVICE FOR ELECTROMAGNETIC DOSIMETRY AND ASSOCIATED METHOD

CROSS REFERENCE TO RELATED APPLICATIONS

This application is a national phase filing under 35 C.F.R. § 371 of and claims priority to PCT Patent Application No. PCT/FR2016/051880, filed on Jul. 2, 2016, which claims the priority benefit under 35 U.S.C. § 119 of French Patent Application No. 1501595, filed on Jul. 24, 2015, the contents of each of which are hereby incorporated in their entireties by reference.

BACKGROUND

Some embodiments relate to electromagnetic dosimetry, and more particularly, some embodiments relate to the measurement of electromagnetic dosimetric quantities in and on the surface of the human body.

The marketing of systems and devices emitting electromagnetic waves at varied emission powers requires obtaining a certain number of certifications of which some are aimed at ensuring the conformity of these devices with user exposure limits.

Various methods and techniques for evaluating the exposure of the human body to electromagnetic waves exist and vary in particular according to the frequency band used. When the frequency is high, the penetration depth of the waves in biological tissues (including in human tissues) decreases. It then becomes relevant to look more particularly at the level of exposure to a given electromagnetic radiation on the tissue surface and on the layers of the epidermis (and more broadly of the skin as a whole). Recent data transmission systems (including wireless) operate at high frequencies of up to several tens of gigahertz. These frequencies do not exist in nature, the effects thereof on human tissues remain relatively unknown or relatively uncharacterised to date.

The analyses already carried out by existing dosimetric methods, currently limited to frequencies of up to 6 GHz, conventionally use devices aiming to simulate the behaviour of the human body and particularly tissue absorption and reflection capabilities. These devices are commonly referred to as "phantoms". Various categories of "phantoms" exist, such as, for example, "liquid phantoms", "semi-solid phantoms" and "solid phantoms". These laboratory devices make it possible to simulate various human tissue profiles having varied dielectric properties and are configured to enable testing in frequency ranges from 30 MHz to 6 GHz. "Liquid phantoms" can include or can consist of a casing (or shell) filled with a gel or a liquid having similar properties to those of the human body. They are generally used from 30 MHz to 6 GHz, but are only of little interest at frequencies greater than 6 GHz and in the millimetric wave range. Indeed, the penetration depth is merely approximately one half-millimetre at 60 GHz. Further "phantoms", described as semi-solid, include water, and make it possible to simulate biological tissues such as muscles, the brain, the skin, for example, but suffer from a problem of longevity associated with a water evaporation phenomenon and the degradation of the resulting dielectric properties thereof.

Solid "phantoms" include ceramic, graphite or carbon elements, or synthetic rubbers and are essentially used for studies of the effects of radiation in and close to the surface of the human body. The main advantages thereof are the reliability thereof and the constancy of the dielectric properties thereof over time. Unfortunately, these solid "phantoms" have the disadvantage of being costly and requiring extreme conditions for the manufacture thereof, including particularly high temperatures and high pressures.

No solid "phantom" having electromagnetic properties equivalent to those of the human body (in terms of complex permittivity and conductivity) and operable above 6 GHz currently exists.

The document "Solid Phantom for Body-Centric Propagation Measurements at 60 GHz" (IEEE transactions on microwaves theory and techniques, VOL. 62, No. 6, June 2014) proposes a solid "phantom" based on a polydimethylsiloxane (PDMS) substrate including metallised carbon black powder on one of the sides thereof. This "phantom" is configured to simulate the behaviour of the human body on the surface, subjected to radiation in frequency ranges around 60 GHz. While the phantom described in this document offers good simulation capabilities of the reflection characteristics of human tissues on the surface, and particularly the skin, the measurements are made using sensors positioned at a certain distance from the "phantom", due to the use of metallised shielding beneath the substrate. It is then easy to analyse the reflected wave (reflected signal) but it remains however impossible, using this "phantom", to measure with precision the exposure levels such as the incident power density or the specific absorption rate.

SUMMARY

The existing solutions have drawbacks.

Some embodiments enhance at least one of the drawbacks discussed above, such as by providing a device suitable for measurements of electromagnetic radiation emitted by an emitter, at frequencies greater than 6 GHz using sensors positioned inside a "phantom" device which simulates the reflection characteristics of biological and particularly human tissues.

For this purpose, a device for simulating characteristics of human tissues in electromagnetic dosimetry is proposed, including a thickness (layer) of substrate bearing a shielding including one or a plurality of conductive materials, optionally metallised, and a thickness (layer) of a dielectric material arranged on and/or beneath the substrate (preferentially beneath the substrate), the device including a plurality of preferentially calibrated openings made in the shielding and further including at least one array of sensors arranged in the dielectric material.

It should be noted that the term "substrate" describes herein a thickness (layer) of material(s) having intrinsic properties, particularly mechanical but also electrical or electromagnetic, suitable for supporting other layers of materials, or for serving as a base thereof. This term should as such not be interpreted strictly in the sense of that used in the field of antennas, but could, for example, be replaced by the term "superstrate", to the extent that, probably, the position thereof is preferentially on the surface of the device.

According to one embodiment of the presently disclosed subject matter, the shielding is metallised and has dimensions equivalent to those of the substrate. In other words, the shielding/reflector covers the entirety or quasi-entirety of the surface of the substrate so as to perform an effective reflection of the radiation emitted.

According to one alternative embodiment, the shielding is embodied using non-metallised elements but liable to form a barrier to electromagnetic waves.

According to another embodiment, the substrate is essentially made of organic or synthetic polymer or resin, such as polydimethylsiloxane (PDMS), for example.

According to another embodiment, the substrate includes carbon black powder or metal powder, carbon nanotubes, by way of non-limiting examples.

According to another embodiment, the dielectric material includes plastic or glass or a polymer. Advantageously, the dielectric material may be of another type, considering that these properties must enable the sensors to receive radiation emitted during test phases.

According to an advantageous or preferred embodiment, the openings made in the shielding are of any number, shape and arrangement. Advantageously, the openings are made in the shielding in slot, cross (intersecting lines), square, circular, triangular or oval shapes and are arranged regularly in the thickness of the shielding, the shielding acting particularly as a reflector.

According to another embodiment, for each of the openings of the shielding, the greatest of the dimensions of the opening has a value between a fraction of the wavelength and several wavelengths, according to the shape of the opening.

Advantageously, the sensors include antennas and/or probes suitable for receiving signals transmitted by the source situated on the other side of the electromagnetic shielding.

Some embodiments relate to an electromagnetic dosimetry method including:
  an emission, of electromagnetic signals at a frequency preferentially greater than 6 GHz, from a source arranged at a predetermined distance from a device for simulating the reflection coefficient of tissues for electromagnetic dosimetry including a substrate bearing a metallised shielding, this shielding including a plurality of calibrated openings, and including a layer of a dielectric material arranged preferentially beneath the substrate, and
  a measurement, using at least one array of sensors arranged in or against the layer of dielectric material, of the side of the substrate opposite the source.

The sensors may be arranged advantageously between two stacked layers of dielectric material.

Advantageously, the predetermined distance between the source and the phantom device is within a range of values ranging from 0 millimetres (direct contact) to 100 cm, these limit values being included in the range.

BRIEF DESCRIPTION OF THE FIGURES

Some embodiments will be understood more clearly, and further specificities and advantages will emerge on reading the following description, the description referring to the appended drawings wherein.

DETAILED DESCRIPTION OF EXEMPLARY EMBODIMENTS

Figure 1:
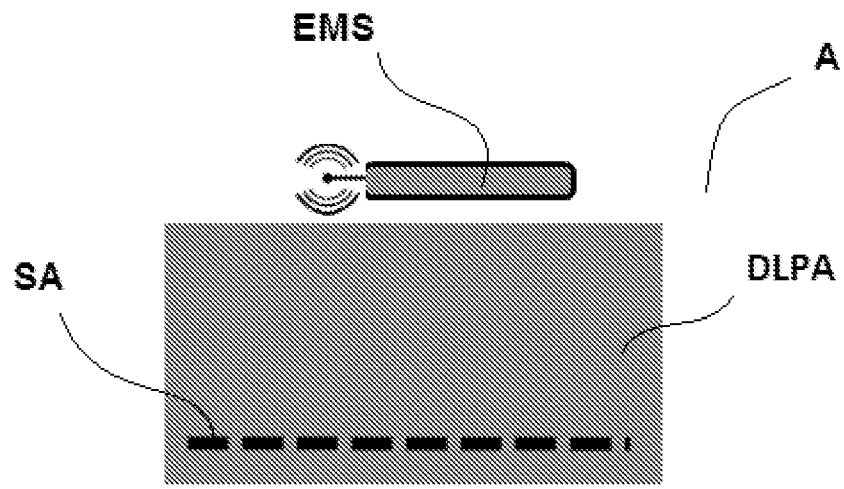
FIG. 1 represents a simulation device configured for electromagnetic dosimetry according to the related art.
Figure 2:
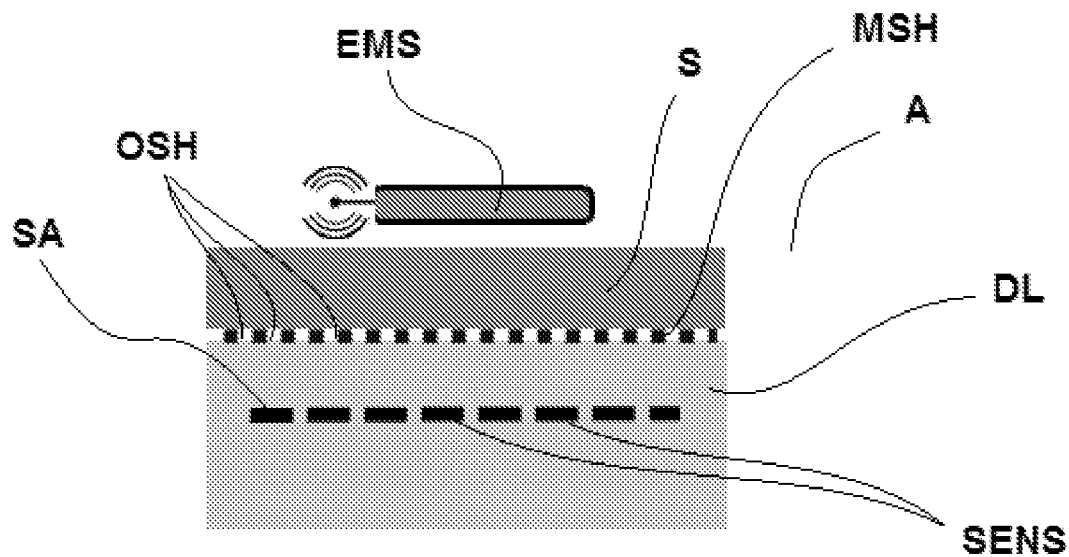
FIG. 2 represents a simulation device configured for electromagnetic dosimetry at frequencies in the 60 GHz band for example according to a particular and non-limiting embodiment.

In FIGS. 1 and 2, the modules represented are functional units, optionally corresponding to physically distinguishable units. For example, these modules or some thereof are grouped into a single component. On the other hand, according to further embodiments, some modules are composed of separate physical entities.

FIG. 1 represents a device A for simulating characteristics of human tissues configured for electromagnetic dosimetry according to the related art. The device A includes a layer of dielectric material DLPA based on water or gel (including a polymer for example) and which includes an array SA of sensors SENS in the layer DLPA.

The device in FIG. 1 is suitable for evaluating the exposure of the human body to one or a plurality of antennas emitting signals at a frequency less than or equal to 6 GHz in the vicinity thereof. The dielectric properties of the phantom device are adjusted to represent those of the human tissues in a given frequency range.

Unfortunately, in the absence of a shell, this type of phantom is degraded over time, due in particular to an evaporation phenomenon in the layer of dielectric materials DL.

FIG. 2 represents a device configured for electromagnetic dosimetry according to a particular and non-limiting embodiment and at frequencies greater than 6 GHz and typically around 60 GHz.

Cleverly, the substrate S bears a shielding MSH acting as a reflector and including preferentially calibrated openings (or holes) OSH and which advantageously provide electromagnetic reflectivity (and "transparency") of the upper part of the phantom A which contributes to the simulation of the reflection characteristics and to a lesser degree the absorption characteristics of human tissues, and particularly the epidermis, dermis and adipose tissues situated below the dermis, at frequencies around 60 GHz.

At these frequencies (above 6 GHz), the absorption of radiation is limited to the superficial layers of the body: at 60 GHz, the penetration depth of electromagnetic radiation in the tissues is of the order of 0.5 mm; the absorption is therefore essentially concentrated in the skin. The epidermis absorbs approximately 30% of the power and the dermis absorbs approximately 69% thereof and the remainder is absorbed by adipose tissues.

Advantageously, the measurement method which uses the phantom A in FIG. 2 includes a step for the emission of electromagnetic signals at a frequency preferentially greater than 6 GHz, and even more preferentially greater than 10 GHz, from a source EMS arranged at a predetermined distance dl (not shown) of the device A for electromagnetic dosimetry including the substrate S bearing the metallised shielding MSH, the shielding MSH including a plurality of calibrated openings OSH, and the device A including the layer DL of a dielectric material arranged beneath the substrate S.

The method includes also and above all a measurement, using at least one array SA of sensors SENS each including one or a plurality of antennas and/or probes and arranged in the layer DL of dielectric material, on the side of the substrate S opposite the source EMS.

Advantageously, this is enabled due to the formation of the calibrated openings OSH in the metallised shielding MSH, arranged along the substrate S of the device A.

The substrate S of the device A is made, according to one particular and non-limiting embodiment, of polydimethylsiloxane, which includes carbon black powder.

The openings OSH are made in slot, or square, circular, triangular or oval shapes and are preferentially arranged in the thickness of the shielding MSH so as to provide a relative transparency to the electromagnetic radiation from the source EMS used.

According to the method, the predetermined distance dl is between 0 and 100 cm, that is possibly in direct contact with the phantom A.

All of the details of the technical operations for defining the signals emitted and analysing the signals extracted by the array (or arrays) of sensors are not detailed further herein, as they are well-known to those of ordinary skill in the art.

According to one alternative embodiment, a layer of dielectric material DL' may be arranged on the surface of the substrate S. The dielectric material of this layer DL' may be identical to that of the layer DL, or different.

Advantageously, the substrate S and the layer of dielectric material DL may be of planar shape or of any shape, to simulate all of part of the human body, for example. This applies in the same way for the shielding.

According to one alternative embodiment, an array of sensors SENS similar to the array of sensors SA is placed in the metallised shielded substrate, in addition to the array situated in the layer of dielectric materials DL.

Advantageously, this makes it possible to obtain a better assessment of the waves absorbed at different depths of the phantom and therefore at different depths of human biological tissues and particularly of the epidermis, dermis and adipose tissue situated beneath the dermis.

According to a further alternative embodiment, a plurality of layers of dielectric materials similar to DL, each having a different permittivity are stacked and include one or a plurality of arrays of sensors so as to evaluate the absorption of electromagnetic radiation at different depths of the epidermis and dermis.

Some embodiments are not limited solely to the embodiment described above but relates obviously to any device for simulating reflection and absorption characteristics of the human body for electromagnetic dosimetry, including a substrate bearing a shielding, optionally metallised, and a layer of a dielectric material arranged on and/or beneath this substrates, and for which the shielding includes a plurality of calibrated openings; the device including at least one array of sensors positioned in the layer of dielectric material. Some embodiments also relate to any method using a device as described in the lines above.

The invention claimed is:

1. A device for electromagnetic dosimetry, comprising:
 a shielding that defines a plurality of openings;
 a layer of substrate, bearing the shielding;
 a layer of a dielectric material arranged on and/or beneath the layer of substrate; and
 at least one array of sensors in the layer of dielectric material,
 wherein the plurality of openings are calibrated to provide to the shield an electromagnetic reflectivity of an upper part of a phantom which contributes to the simulation of the reflection characteristics of human tissues,
 wherein the at least one array of sensors include one or a plurality of antennas and/or probes, the at least one array of sensors being suitable for receiving signals transmitted by a source situated on the other side of the shield,
 wherein the dielectric material includes plastic or glass or polymer and the plurality of openings are arranged in a thickness of the shielding to provide a relative transparency to the signal transmitted from the source,
 wherein the at least one array of sensors are arranged on the side of the layer of substrate opposite the source.

2. The device according to claim 1, wherein the substrate is essentially made of organic or synthetic polymer or resin.

3. The device according to claim 1, wherein the openings in the shielding are made in slot, or square, circular, triangular or oval shapes, and are arranged regularly in the thickness of the shielding.

4. The device according to claim 1, wherein the greatest of the dimensions of the openings has a value between a fraction of the wavelength and some ten wavelengths.

5. An electromagnetic dosimetry method, comprising:
 emitting electromagnetic signals at a frequency preferentially greater than 6 GHz, from a source arranged at a predetermined distance from a device for electromagnetic dosimetry according to claim 1; and
 measuring, using at least one array of sensors arranged in or against the layer of dielectric material, on the side of the substrate opposite the source.

6. The method according to claim 5, wherein the predetermined distance between the source and the device, is within a range of values ranging from 0 millimeters to 100 centimeters, these limit values being included in the range.

7. The device according to claim 2, wherein the openings in the shielding are made in slot, or square, circular, triangular or oval shapes, and are arranged regularly in the thickness of the shielding.

8. The device according to claim 2, wherein the greatest of the dimensions of the openings has a value between a fraction of the wavelength and some ten wavelengths.

9. The device according to claim 2, wherein the sensors include antennas and/or probes.

10. The device according to claim 3, wherein the sensors include antennas and/or probes.

11. The device according to claim 4, wherein the sensors include antennas and/or probes.

* * * * *